(12) United States Patent
Jeong et al.

(10) Patent No.: US 9,099,587 B2
(45) Date of Patent: Aug. 4, 2015

(54) EDUCATIONAL SOLAR CELL MODULE

(76) Inventors: Yeong Sik Jeong, Goyang-si (KR); Jung Wook Han, Uijeongbu-si (KR)

(*) Notice: Subject to any disclaimer, the term of this patent is extended or adjusted under 35 U.S.C. 154(b) by 62 days.

(21) Appl. No.: 13/995,289

(22) PCT Filed: Nov. 9, 2011

(86) PCT No.: PCT/KR2011/008491
§ 371 (c)(1),
(2), (4) Date: Jun. 18, 2013

(87) PCT Pub. No.: WO2012/086922
PCT Pub. Date: Jun. 28, 2012

(65) Prior Publication Data
US 2013/0284243 A1 Oct. 31, 2013

(30) Foreign Application Priority Data
Dec. 20, 2010 (KR) .................. 10-2010-0130616

(51) Int. Cl.
*H01L 31/042* (2014.01)
*H02N 6/00* (2006.01)
*H01L 31/05* (2014.01)
*H02S 30/10* (2014.01)

(52) U.S. Cl.
CPC ........ *H01L 31/0424* (2013.01); *H01L 31/0504* (2013.01); *H02S 30/10* (2014.12); *Y02E 10/50* (2013.01)

(58) Field of Classification Search
CPC ............ H01L 31/0424; H01L 31/0504; H01L 31/0508
USPC .......................................... 136/251
See application file for complete search history.

(56) References Cited

U.S. PATENT DOCUMENTS

| 7,487,771 B1* | 2/2009 | Eiffert et al. ............... 126/622 |
| 2008/0302030 A1* | 12/2008 | Stancel et al. .............. 52/173.3 |
| 2010/0162641 A1* | 7/2010 | Reyal et al. ................. 52/173.3 |

FOREIGN PATENT DOCUMENTS

| JP | 2002-299667 A | 10/2002 |
| KR | 20-2008-0000864 U | 5/2008 |
| KR | 10-2009-0079855 A | 7/2009 |
| KR | 10-2010-0109871 | 10/2010 |
| WO | WO 2010019742 A2 * | 2/2010 |

* cited by examiner

*Primary Examiner* — Eli Mekhlin
(74) *Attorney, Agent, or Firm* — R. Neil Sudol; Henry D. Coleman

(57) ABSTRACT

The present invention relates to an educational solar cell module. According to the present invention, the electrodes of the solar cells can be easily and removably connected to each other in series or in parallel, and the variations in voltage and current according to the number of connected solar cells can be easily observed to thereby increase interest in solar energy. The educational solar cell module includes: a plurality of frames; a solar cell panel joined to the top surface of the frames; and a frame coupling member disposed on the frames to couple neighboring frames to each other so that the frames can be continuously joined and arrayed.

9 Claims, 6 Drawing Sheets

EDUCATIONAL SOLAR CELL MODULE

TECHNICAL FIELD

The present invention relates to a solar cell module for use as a teaching aid, and more particularly, to a solar cell module for use as a teaching aid, which allows electrodes of solar cells to be easily and removably connected to each other in series or in parallel, and allows changes in voltage and current depending on the number of solar cell modules to be easily observed, thereby increasing interest in solar energy.

BACKGROUND ART

Photovoltaic (PV) cells or solar cells are material junction devices transforming sunlight into direct current (DC) power. In a photovoltaic cell, photovoltaic voltage is generated from a junction, and available current is determined by the area and other parameters of the photovoltaic cell.

The area of an actual solar panel is determined to provide required power while optimizing other parameters. The solar panel is manufactured by tiling a plurality of solar cells having an optimal size determined to minimize manufacturing costs. The number of solar cells is determined through compromise between panel operating voltage and current (I).

One type of PV system generally includes a stand-alone system, which provides power or includes a local storage for direct use. Another type of PV system is connected to a typical utility grid having an appropriate power converter to generate alternating current (AC) compatible with any typical utility grid. On the whole, the PV systems can generate power for various purposes, for example, remote use, battery charge for navigation, telecommunication equipment, user electronic devices such as calculators, watches, radios, and the like.

Typical PV cells include a p-type silicon wafer or sheet, which is formed at an upper side thereof with an n-type silicon layer to form a p-n junction generating an electric field, and generally has a thickness of less than about 0.3 mm.

In addition, a solar module is formed by tiling a plurality of PV cells arranged on a protective film and a carrier glass sheet and bonded thereto to form a solar panel having an appropriate size for a desired power output and wired to provide desired output voltage and current.

DISCLOSURE

Technical Problem

Since such solar cell modules are coupled to each other by bolts, screws, bonding agents, and the like, it is very difficult to disassemble the solar cell modules once assembled, causing significant deterioration in assembly performance, and to provide various arrangements of the solar cell modules.

Therefore, there is a need for a photovoltaic cell that overcomes such problems.

The present invention has been conceived to solve such problems in the art, and it is an aspect of the present invention to provide a solar cell module for use as a teaching aid, which allows electrodes of solar cells to be easily and removably connected to each other in series or in parallel so as to improve assembly performance, and allows changes in voltage and current to be easily observed, thereby increasing interest in solar energy.

Technical Solution

In accordance with an aspect of the present invention, a solar cell module for use as a teaching aid includes: a frame; a solar cell panel bonded to an upper side of the frame; and a frame coupling member provided to the frame and coupling adjacent frames to each other such that the frames are continuously coupled and arranged.

The solar cell module for use as a teaching aid may further include electrode members provided to the frame so as to be connected to the solar cell panel and electrically connecting the mutually coupled frames to each other.

The solar cell module for use as a teaching aid may further include a protective member protecting the solar cell panel while securing the solar cell panel and the electrode member to the frame.

The protective member may be formed of a transparent resin.

The frame coupling member may include a magnetic body, and a securing groove formed on the frame and securing the magnetic body inserted thereinto.

The frame may be formed with a plurality of securing grooves along an edge of the upper side thereof.

The frame coupling member may include an insertion groove formed on the frame, and a latch member formed on the frame to be inserted into the insertion groove and secured thereto.

The frame coupling member may include a concave portion formed on a lateral side of the frame, and a convex portion formed on the frame so as to be inserted into the concave portion and secured thereto.

Each of the electrode members may include a first conductive portion covering one lateral side of the frame, and second conductive portions bent at opposite ends of the first conductive portion and partially covering lateral sides adjacent to the one lateral side of the frame.

Each of the electrode members may further include a third conductive portion extending from the electrode member towards the upper side of the frame to be connected to the solar cell panel.

The frame may (+) and (−) poles formed on opposite lateral sides corresponding to the first conductive portions, and (+) and (−) poles formed on other opposite lateral sides corresponding to the second conductive portions.

Advantageous Effects

According to the present invention, the solar cell module for use as a teaching aid allows electrode members to be easily and removably coupled to each other in series or in parallel by a frame coupling member including a magnetic body, thereby improving assembly performance of the solar cell module.

In addition, according to the present invention, the solar cell modules for use as a teaching aid can be easily and removably coupled to each other in series or in parallel, such that changes in voltage and current can be easily observed, thereby increasing interest in solar energy.

MODE FOR INVENTION

Hereinafter, embodiments of the present invention will be described with reference to the accompanying drawings. It should be noted that the drawings are not to precise scale and may be exaggerated in thickness of lines or size of components for descriptive convenience and clarity. Furthermore, the terms used herein are defined by taking functions of the present invention into account and can be changed according to user or operator custom or intention. Therefore, definition of the terms should be made according to the overall disclosure.

Figure 1:
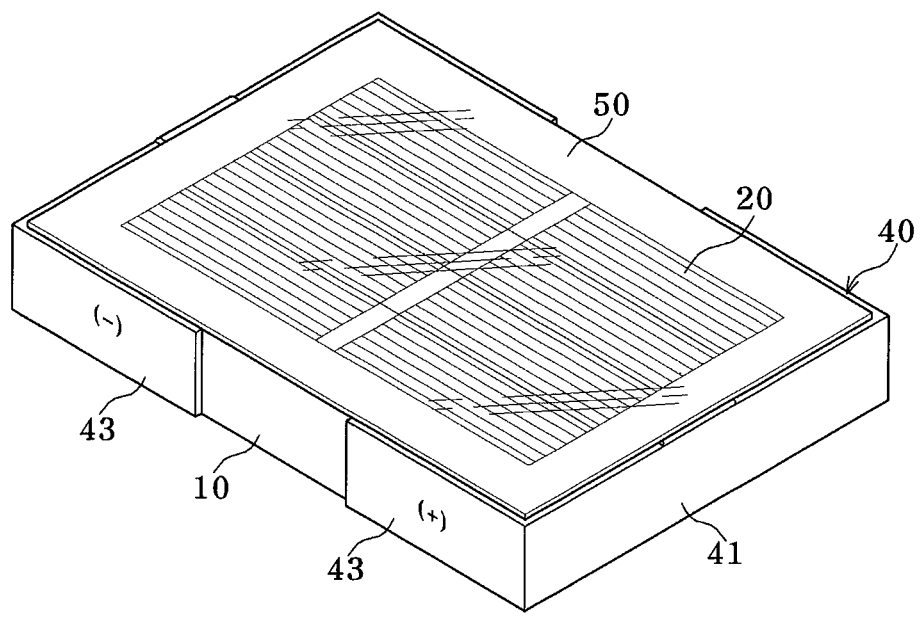
FIG. 1 is a perspective view of a solar cell module for use as a teaching aid according to one embodiment of the present invention.
Figure 2:
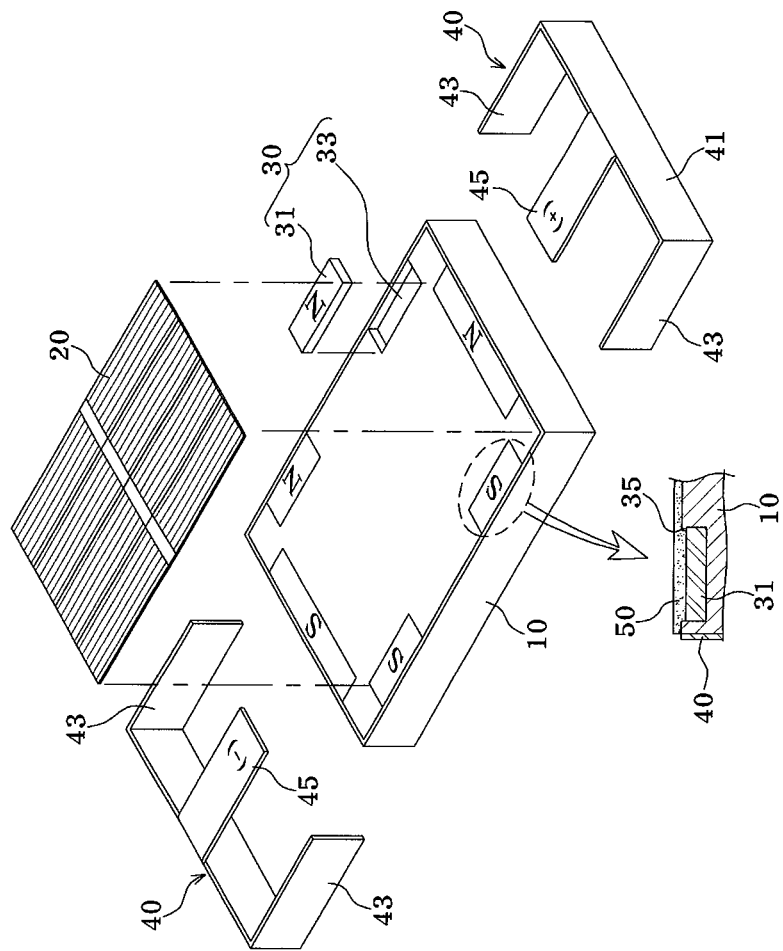
FIG. 2 is an exploded perspective view of the solar cell module for use as a teaching aid shown in FIG. 1.

FIG. 1 is a perspective view of a solar cell module for use as a teaching aid according to one embodiment of the present invention, and FIG. 2 is an exploded perspective view of the solar cell module for use as a teaching aid shown in FIG. 1.

Figure 3:
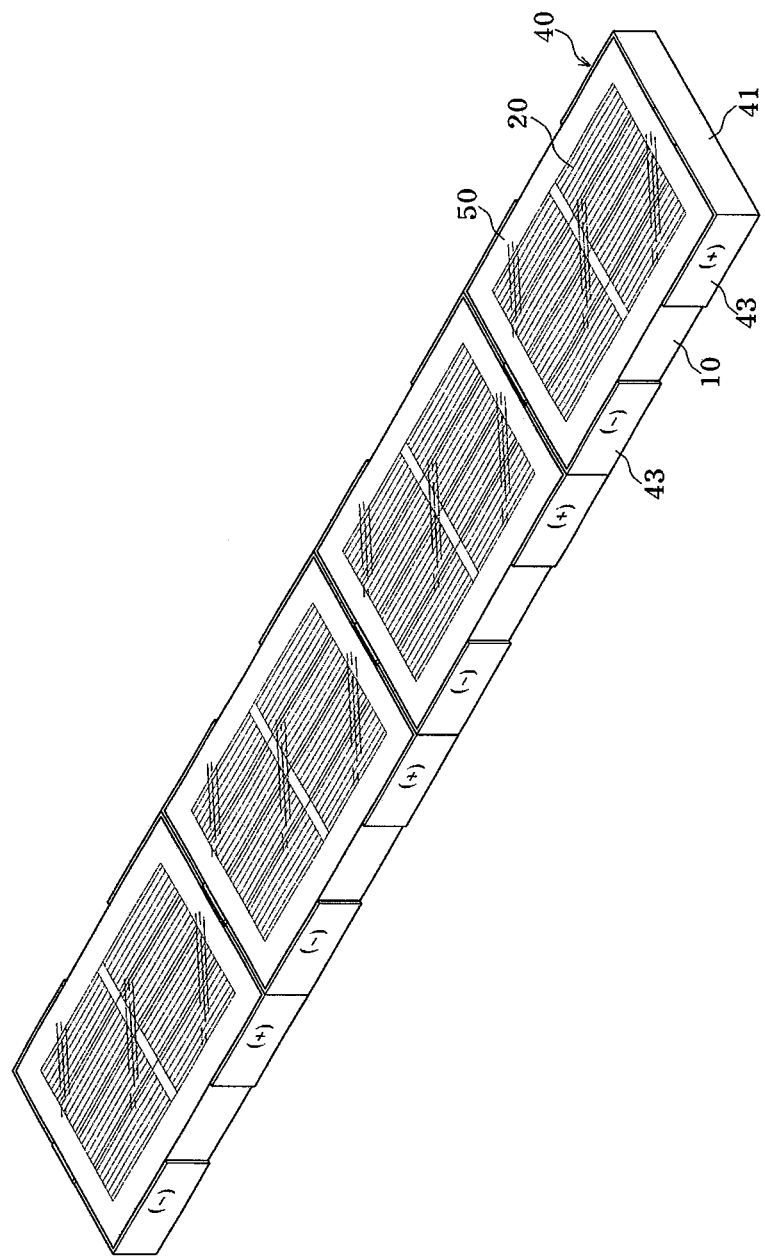
FIG. 3 is a perspective view of the solar cell module for use as a teaching aid connected in series according to the embodiment of the present invention.
Figure 4:
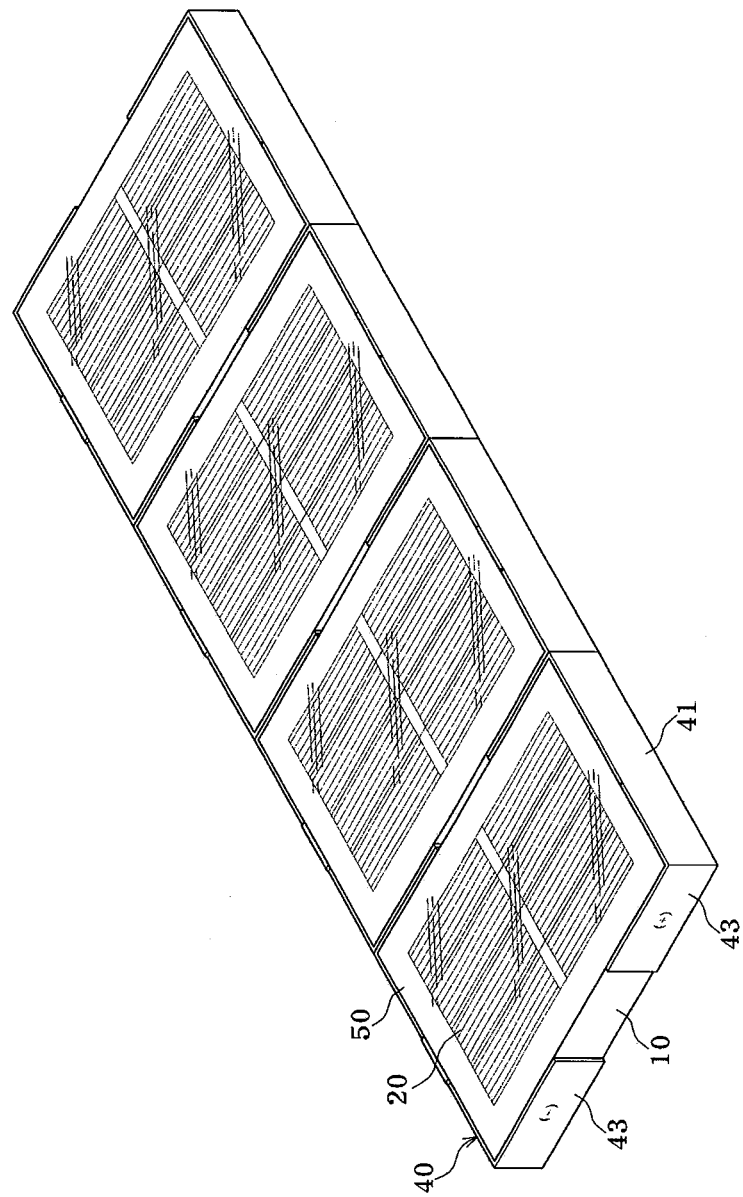
FIG. 4 is a perspective view of the solar cell modules for use as a teaching aid connected in parallel according to the embodiment of the present invention.

In addition, FIG. 3 is a perspective view of the solar cell module for use as a teaching aid connected in series according to the embodiment of the present invention, and FIG. 4 is a perspective view of the solar cell modules for use as a teaching aid connected in parallel according to the embodiment of the present invention.

Referring to FIGS. 1 to 4, a solar cell module for use as a teaching aid according to one embodiment of the invention includes a frame 10, a solar cell panel 20, and frame coupling members 30.

The solar cell module further includes electrode members 40 and a protective member 50.

The frame 10 has a rectangular shape to achieve efficient contact of the electrode members 40 thereon, and the solar cell panel 20 is bonded to an upper side of the frame 10. The frame 10 may be modified into various polygonal shapes, such as a triangular shape, a pentagonal shape, and the like, as needed.

The solar cell panel 20 employs thin plate-shaped solar cells, which are continuously arranged from side to side on the upper side of the frame 10. In the solar cell panel 20, the solar cells are arranged to have edges contacting each other, and thus are electrically connected to each other.

In addition, the solar cells are arranged to generate a voltage of 0.5 V. However, it should be understood that the present invention is not limited to a voltage of 0.5 V, and may be modified in various ways, as needed.

Each of the frame coupling members 30 is provided to the frame 10 and couples the frame 10 to another frame 10 adjacent thereto such that the frames 10 can be continuously coupled and arranged.

To this end, each of the frame coupling members 30 includes a magnetic body 31 to be coupled to the frame 10, and a securing groove 33 formed on the upper side of the frame 10 and receiving the magnetic body 31 secured thereto.

The magnetic bodies 31 are coupled to the frame 10 such that opposite sides of the frame 10, for example, left and right sides of the frame 10, have different polarities. Thus, the left side of one frame 10 is coupled to the right side of another frame 10 by a magnetic force between the magnetic bodies 31 having different polarities.

In addition, the magnetic bodies 31 are also coupled to the frame 10 such that two other opposite sides of the frame 10, for example, front and rear sides of the frame 10, have different polarities.

In this way, the magnetic bodies 31 are coupled to the frames 10 along edges thereof to have different polarities, whereby the frames 10 can be continuously connected to each other in a longitudinal or transverse direction.

The magnetic body 31 may employ a neodymium magnet, which is a permanent magnet.

The securing groove 31, to which the magnetic body 31 is coupled, is formed along the edge of the upper side of the frame 10. Here, the securing groove 31 is formed on an inner surface thereof with a holding bump 35 which holds an upper side of the magnetic body 31 such that the magnetic body 31 can be safely secured to the securing groove 31.

The electrode members 40 electrically connect the solar cell panels 20 of the frames 10, which are mutually coupled to each other by the magnetic bodies 31, and may be formed to connect the solar cell panels 20 to each other in series or in parallel depending on a coupling direction of the frames 10. For example, when the frames 10 are continuously coupled to each other in the longitudinal direction, the electrode members 40 connect the solar cell modules to each other in series, and when the frames 10 are continuously coupled in the transverse direction, the electrode members 40 connect the solar cell modules to each other in parallel.

To this end, each of the electrode members 40 includes a first conductive portion 41, second conductive portions 43 and a third conductive portion 45, and is coupled to either side of the frame 10. One of the electrode members 40 is connected to a (−) pole of the solar cell panel 20 and exhibits a (−) polarity, and the other electrode member 40 is connected to a (+) pole of the solar cell panel 20 and exhibits a (+) polarity.

In addition, the electrode members 40 are coupled to the frame 10 such that the first conductive portions cover left and right sides of the frame 10. When the frames 10 are continuously coupled in the longitudinal direction, the solar cell modules for use as a teaching aid are connected in series by the first conductive portions 41 which completely cover the left and right sides of the frame 10.

Further, in each of the electrode members 40, the second conductive portions 43 are bent at opposite ends of the first conductive portion 41 and cover front and rear sides of the frame 10. Since the (+) and (−) poles are formed on the front and rear sides of the frame 10 by the second conductive portions 43, the solar cell modules for use as a teaching aid are connected in parallel when the frames 10 are continuously coupled in the transverse direction.

Furthermore, the third conductive portion 45 of the electrode member 40 is placed on the upper side of the frame 10 and electrically connected to the solar cell panel 20. To this end, the third conductive portion 45 extends from an upper end of the first conductive portion 41 toward the upper side of the frame 10 and is placed under the solar cell panel 20.

The solar cell panel 20, the frame coupling member 30 and the third conductive portion 45 coupled to the upper side of the frame 10 are kept in a coupled state by the protective member 50.

The protective member 50 secures the solar cell panel 20 and the electrode members 40 to the frame 10 while protecting the solar cell panel 20. To this end, the protective member 50 is formed of a resin layer to cover the upper side of the frame 10.

Here, the protective member 50 is formed of a transparent resin by injection molding to protect the solar cell panel 20, the frame coupling members 30 and the third conductive portion 45 while ensuring efficient current generation of the solar cell panel 20.

In addition, contact between the solar cell panel 20 and the third conductive portion 45 is more stably maintained by the protective member 50.

The protective member 50 may have various thicknesses.

Now, operation of the solar cell module for use as a teaching aid according to the embodiment of the invention will be described.

When the solar cell modules for use as a teaching aid are continuously arranged in the longitudinal direction, left and right sides of the adjacent solar cell modules for use as a teaching aid are coupled to each other by the magnetic bodies 31 of the frame coupling members 30. Then, the solar cell modules for use as a teaching aid are connected to each other in series by the first conductive portions 41 of the electrode members 40.

Here, since a single solar cell module generates, for example, a voltage of 0.5 V, a voltage of 2 V is generated by four solar cell modules for use as a teaching aid connected to each other in series.

When the magnetic bodies 31 are coupled to each other such that the solar cell modules for use as a teaching aid are continuously arranged in the transverse direction, the solar cell modules for use as a teaching aid are connected to each other in parallel by the second conductive portions 43.

For example, when the solar cell modules for use as a teaching aid each generating a voltage of 0.5 V are connected to each other in parallel, a voltage of 0.5 V is generated by these solar cell modules for use as a teaching aid regardless of the number of solar cell modules for use as a teaching aid.

In this manner, since the solar cell modules for use as a teaching aid may be be connected to each other in series or in parallel depending on the coupling direction thereof, such as the longitudinal direction and the transverse direction, the solar cell modules used as a teaching aid allow changes in voltage and current depending on arrangement thereof to be easily observed, thereby increasing interest in solar energy together with understanding of electrical energy.

That is, the solar cell modules according to this embodiment may be utilized as a teaching aid for measurement of current and voltage.

In addition, since the solar cell modules for use as a teaching aid are coupled to each other by the magnetic bodies 31 when connected in series or in parallel, the solar cell module for use as a teaching aid according to the present embodiment has improved assembly performance by facilitating coupling and decoupling thereof.

Further, the electrode members 40 each including the first conductive portion 41 and the second conductive portions 43 allow the solar cell modules for use as a teaching aid to be easily connected to each other in series or in parallel by facilitating determination as to series connection and parallel connection.

Figure 5:
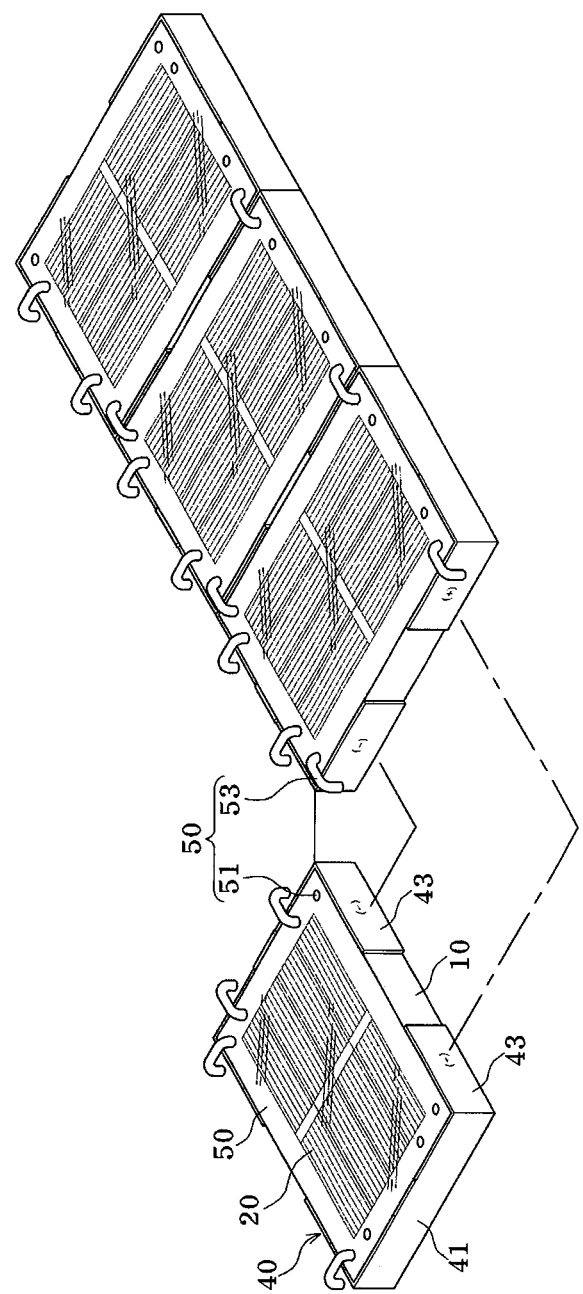
FIG. 5 is a perspective view of a modified form of a frame coupling member of the solar cell module according to the embodiment of the present invention.
Figure 6:
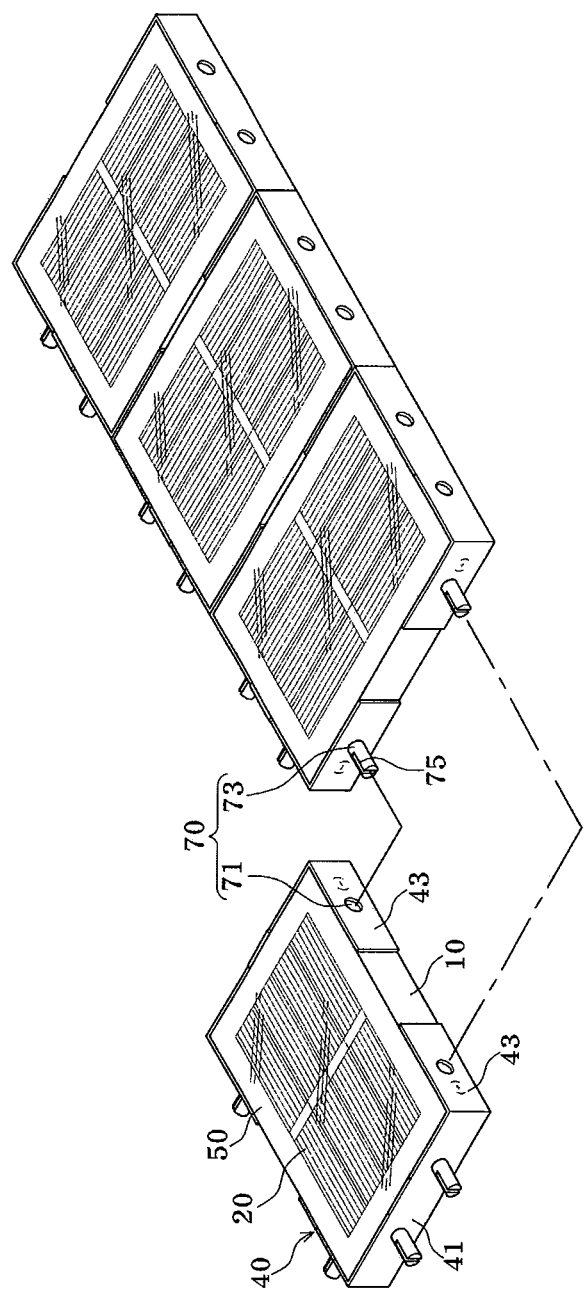
FIG. 6 is a perspective view of another modified form of the frame coupling member of the solar cell module according to the embodiment of the present invention.

On the other hand, as shown in FIGS. 5 and 6, the frame coupling member may be modified in various ways.

First, referring to FIG. 5, a modified frame coupling member 60 includes insertion recesses or holes 61 formed on the upper side of the frame 10, and latch members 63 inserted into the insertion recesses or holes 61 and secured thereto.

Here, the insertion grooves 61 and the latch member 63 are respectively formed at opposite sides on the upper side of each frame 10. For example, when the insertion grooves 61 are respectively formed at left and front portions on the upper side of the frame 10, the latch members 63 are respectively formed at right and rear portions thereof. Locations of the insertion grooves 61 and the latch members 63 may be modified in various ways, as needed.

In addition, referring to FIG. 6, another modified frame coupling member 70 includes a female connector portion or recess 71 formed on one lateral side of the frame 10, and a male connector portion or projection 73 formed on the other lateral side of the frame 10 to be inserted into the female portion 71 and secured thereto.

The female portion 71 and the male portion 73 are respectively formed at opposite sides of each frame 10. In addition, the male portion 73 has a slot 75 formed along a length thereof so as to be more stably secured to the female portion 71. The slot 75 allows the male portion 73 inserted into the female portion 71 to have elasticity and to be more stably secured thereto.

Although some embodiments have been disclosed herein, it should be understood by those skilled in the art that these embodiments are provided by way of illustration only, and that various modifications, changes, and alterations can be made without departing from the spirit and scope of the invention. The scope of the invention should be limited only by the accompanying claims and equivalents thereof.

The invention claimed is:

1. A solar cell module comprising:
a frame;
a solar cell panel bonded to an upper side of the frame; and
a frame coupling member mounted to the frame and configured for mechanically coupling at least one other solar cell module to the frame, the frame coupling member including a magnetic body seated in a groove or recess formed on the frame.

2. The solar cell module according to claim 1, further comprising: electrode members mounted to the frame so as to be connected to the solar cell panel and configured for electrically connecting the solar cell panel to a solar cell panel of the other solar cell module.

3. The solar cell module according to claim 2, further comprising: a protective member protecting the solar cell panel while securing the solar cell panel and the electrode member to the frame.

4. The solar cell module according to claim 3, wherein the protective member is formed of a transparent resin.

5. The solar cell module according to claim 2, wherein each of the electrode members comprises: a first conductive portion covering one lateral side of the frame, and second conductive portions bent at opposite ends of the first conductive portion and partially covering lateral sides adjacent to the one lateral side of the frame.

6. The solar cell module according to claim 5, wherein each of the electrode members further comprises a third conductive portion extending from the electrode member towards the upper side of the frame to be connected to the solar cell panel.

7. The solar cell module according to claim 5, wherein the frame comprises (+) and (−) poles formed on opposite lateral sides corresponding to the first conductive portions, and (+) and (−) poles formed on other opposite lateral sides corresponding to the second conductive portions.

8. The solar cell module according to claim 1, wherein the frame is formed with a securing structure proximate the groove or recess and configured to retain the magnetic body in the groove or recess.

9. The solar cell module according to claim 8, wherein the frame is formed with a plurality of seating grooves along an edge of the upper side thereof, each of the seating grooves receiving a respective magnetic body.

* * * * *